United States Patent
Ishikawa

(10) Patent No.: US 6,653,874 B2
(45) Date of Patent: Nov. 25, 2003

(54) CLOCK PRODUCING CIRCUIT CAPABLE OF SUPPRESSING PHASE SHIFT AT A TIME OF CHANGE FROM ACTIVE CLOCK TO STANDBY CLOCK

(75) Inventor: Yasuaki Ishikawa, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 10/212,058

(22) Filed: Aug. 6, 2002

(65) Prior Publication Data

US 2003/0030475 A1 Feb. 13, 2003

(30) Foreign Application Priority Data

Aug. 7, 2001 (JP) ........................................ 2001-239279

(51) Int. Cl.[7] .............................................. H04L 25/36
(52) U.S. Cl. ........................ 327/144; 327/156; 327/147
(58) Field of Search ................................. 327/156, 157, 327/158, 105, 141, 144, 145, 147

(56) References Cited

U.S. PATENT DOCUMENTS 6,275,553 B1 * 8/2001 Esaki ........................ 327/151

FOREIGN PATENT DOCUMENTS

| GB | 2 286 300 A | 8/1995 |
|---|---|---|
| JP | 9-64732 A | 3/1997 |
| JP | 10-187272 A | 7/1998 |
| JP | 2000-261420 A | 9/2000 |

\* cited by examiner

Primary Examiner—Dinh T. Le
(74) Attorney, Agent, or Firm—Sughrue Mion, PLLC

(57) ABSTRACT

A clock producing circuit comprises a phase comparator to produce a comparison signal representing phase difference between a first output clock produced by a first PLL and a second output clock produced by a second PLL. The comparison signal is supplied to a digital filter included in the second PLL. The digital filter updates filter coefficients thereof to reduce the phase difference while the first output clock is selected as a selected output signal. Thus, the second output clock coincides the first output clock in phase. If the first reference clock disappears, the second output clock instead of the first output clock is selected as the selected output clock. At the same time, the digital filter stops updating the filter coefficients. A phase shift is not caused in the selected output clock by changing from the first output clock to the second output clock.

11 Claims, 5 Drawing Sheets

CLOCK PRODUCING CIRCUIT CAPABLE OF SUPPRESSING PHASE SHIFT AT A TIME OF CHANGE FROM ACTIVE CLOCK TO STANDBY CLOCK

BACKGROUND OF THE INVENTION

This invention relates to a clock producing circuit receiving active and standby clocks, in particular, to a clock producing circuit which is capable of suppressing a phase shift at the time of a change from an active reference clock to a standby reference clock.

Generally, active and standby reference clocks are supplied to a synchronous clock producing circuit used in a synchronous timing control system for an apparatus that high reliability is required. According to such structure, even if the active reference clock disappears (or comes into an abnormal state), the synchronous clock producing circuit is still able to produce an output clock by using the standby reference clock instead of the active reference clock. Thus the synchronous clock producing circuit can supply the output clock to the apparatus even if it can not receive the active reference clock.

However, the standby reference clock does not always correspond to the active reference clock in phase. If the change from the active reference clock to the standby reference clock is performed under the condition that the phase of the standby reference clock does not correspond to that of the active reference clock, the output clock has a phase shift or change at the time of a change from the active reference clock to the standby reference clock.

SUMMARY OF THE INVENTION

It is therefore an object of this invention to provide a clock producing circuit capable of suppressing a phase shift of an output clock at the time of a change between reference clocks.

Other object of this invention will become clear as the description proceeds.

According to an aspect of this invention, a clock producing circuit receives first and second reference clocks at first and second input terminals. The clock producing circuit comprises first phase locked loop connected to the first input terminal to receive the first reference clock and to produce a first output clock having first phase according to the first reference clock. A second phase locked loop has a digital filter with filter coefficients and is connected to the second input terminal to receive the second reference clock and to produce a second output clock having second phase according to the second reference clock. A comparing portion is connected to the first phase locked loop and the second phase locked loop to compare the first phase with the second phase and to supply a filter coefficient control signal representative of difference between the first phase and the second phase to the digital filter. The digital filter updates the filter coefficients according to the filter coefficient control signal so as to reduce the difference between the first phase and the second phase.

According to another aspect of this invention, a clock producing circuit has first and second phase locked loops to produce first and second output clocks according to first and second reference clocks. The clock producing circuit comprises a subsidiary phase comparator connected to the first and second phase locked loops to compare phase of the first output clock with that of the second output clock and to produce a subsidiary comparison signal representing phase difference between the first and second output clocks. A phase adjusting portion is included in the second phase locked loop and connected to the subsidiary phase comparator to adjust phase of the second output clock on the basis of the subsidiary comparison signal so that the phase of the second output clock coincides with that of the first output clock.

According to still another aspect of this invention, a clock producing method comprising the steps of producing a first output clock according to a first reference clock by the use of a first phase locked loop, producing a second output clock according to a second reference clock by the use of a second phase locked loop, comparing phase of the first output clock with that of the second output clock to produce a comparison signal representing phase difference between the first and the second output clocks, and adjusting phase of the second output clock according to the comparison signal by the use of a digital filter included in the second phase locked loop so as to reduce said phase difference.

DESCRIPTION OF THE PREFERRED EMBODIMENT

Figure 1:
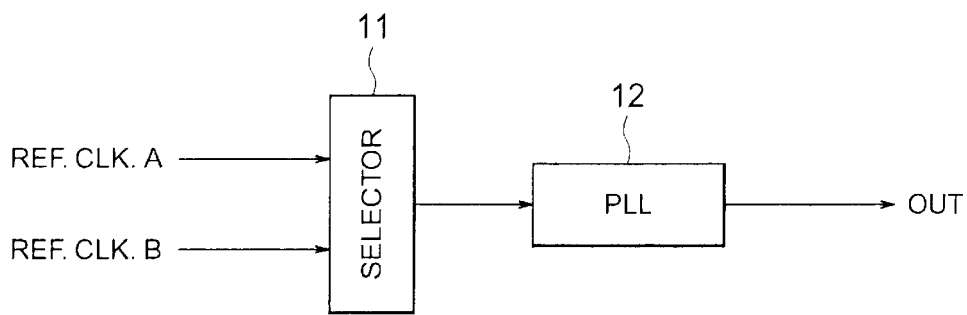
FIG. 1 is a block diagram showing a structure of a conventional synchronous clock producing circuit.

Referring to FIG. 1, description will be at first directed to a conventional synchronous clock producing circuit.

As shown in FIG. 1, the conventional synchronous clock producing circuit comprises a selector 11 and a phase locked loop (PLL) 12. The selector 11 receives two reference clocks A and B and selectively supplies one of them to the PLL 12. The PLL 12 produces an output clock synchronized with the reference clock A or B supplied from the selector 11.

When the reference clock A or B selected by the selector 11 disappears or comes into an abnormal state, the selector 11 executes a change between the reference clocks A and B. For example, the selector 11 changes from the reference clock A to the reference clock B. Consequently, the PLL 12 produces the output clock synchronized with the reference clock B after the change from the reference clock A to the reference clock B.

Figure 2:
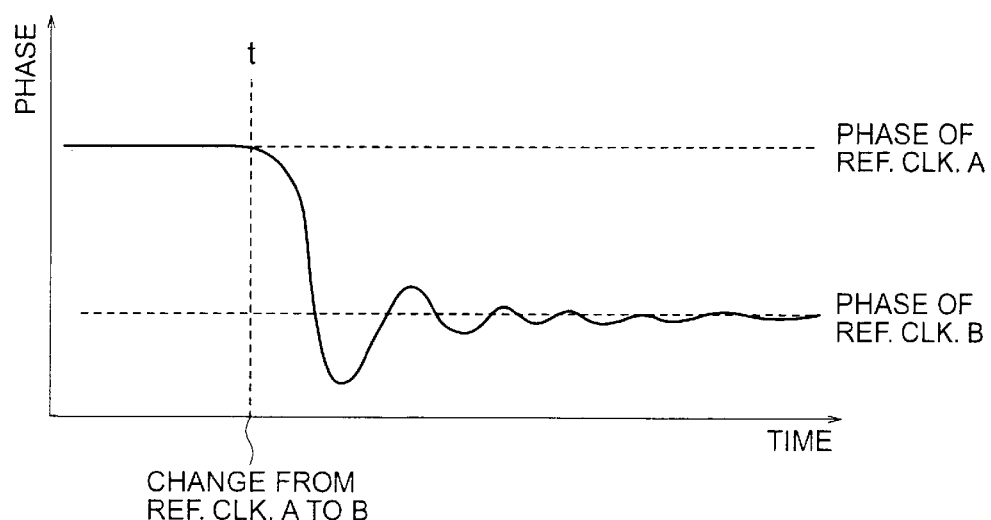
FIG. 2 is a graph showing time variation of a phase of an output clock produced by the conventional synchronous clock producing circuit of FIG. 1.

It is desirable that the reference clocks A and B coincides with (or corresponds to) each other in phase. However, the phase of the reference clock B does not always corresponds to that of the reference clock A. Phase difference between the reference clocks A and B causes a phase shift and/or sharp phase changes into the output clock at the time of the change between the reference clocks A and B. FIG. 2 shows time variation of the phase of the output signal before and after the change between the reference clocks A and B.

In FIG. 2, the change between the reference clocks A and B is made at the time of "t" and the phase shift and the sharp phase changes occur after the time of "t". In the case where the clock producing circuit is used in a transmitting/receiving apparatus, the phase shift and the sharp phase changes are likely to make impossible to carry out transmitting, receiving, sampling or the like at regular timings.

To suppress the sharp phase changes, another conventional clock producing circuit disclosed in Japanese Unexamined Patent Publication 9-64732, namely, JP-A 9-64732 uses a holdover state of a digital filter included in a phase locked loop circuit. The lock producing circuit is shown in FIG. 3.

Figure 3:
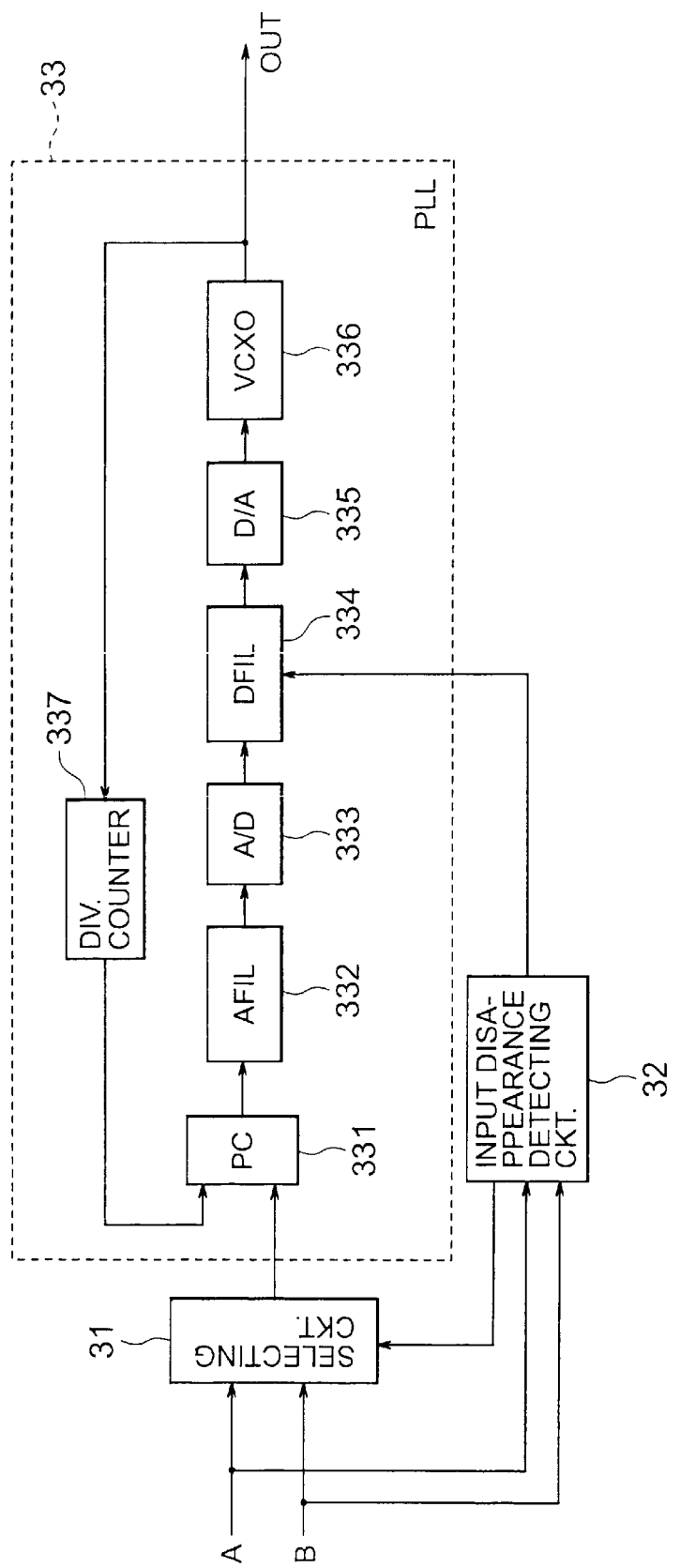
FIG. 3 is a block diagram showing a structure of another conventional synchronous clock producing circuit considering sharp phase changes at the time of a change between reference clocks.

In FIG. 3, the clock producing circuit comprises a selecting circuit 31, an input disappearance detecting circuit 32 and a phase locked loop (PLL) 33.

The PLL 33 comprises a phase comparator (PC) 331, an analog filter (AFIL) 332, an analog to digital converter (A/D) 333, a digital filter (DFIL) 334, a digital to analog converter (D/A) 335, a voltage controlled oscillator 336, and a dividing counter 337.

Now, it is assumed that the selecting circuit 31 selects a reference clock A to supply it to the PLL 33. The input disappearance detecting circuit 32 demands that the digital filter 334 comes into the holdover state when it does not receive the reference clock A. The digital filter 334 reduces a loop gain of the PLL 33 in response to the demand from the input disappearance detecting circuit 32. Thus, the PLL 33 comes into the holdover state. Under the holdover state, the PLL 33 produces the output clock with a fixed phase.

The input disappearance detecting circuit 32 further makes the selecting circuit 31 select a reference clock B. When the selecting circuit 31 selects the reference clock B, the input disappearance detecting circuit 32 demands that the digital filter 334 returns from the holdover state. In consequence, the output clock is synchronized with the reference clock B. In this event, because the loop gain of the PLL 33 is small, the sharp phase changes do not appear on the output clock. Accordingly, a next-stage PLL circuit (not shown) connected to an output terminal of the PLL 33 can follow the changes of the output clock.

Figure 4:
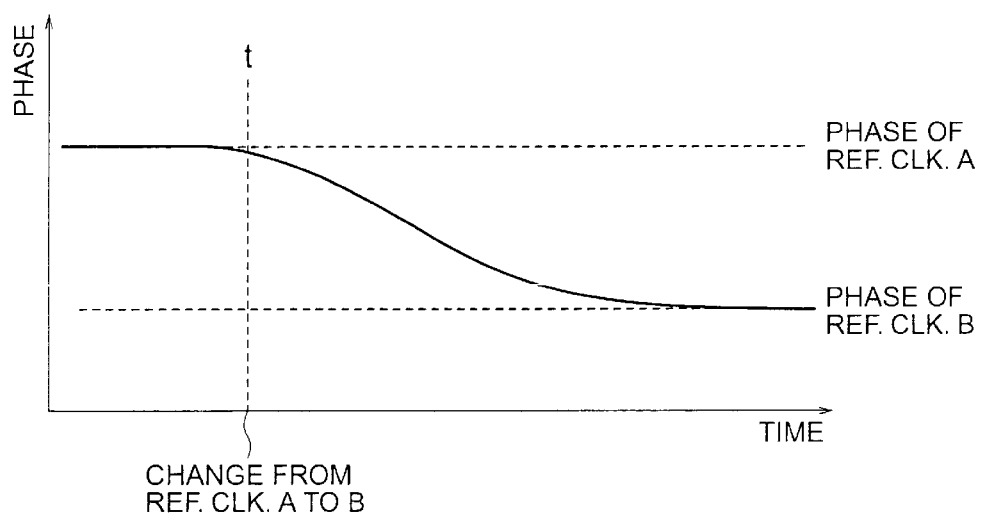
FIG. 4 is a graph showing time variation of a phase of an output clock produced by the conventional synchronous clock producing circuit of FIG. 3.

However, the clock producing circuit of FIG. 3 does not consider phase difference between the reference clocks A and B. That is, when there is phase difference between the reference clocks A and B and the change is performed between them, the phase shift occurs in the output clock as shown in FIG. 4.

Some techniques considering the phase shift are disclosed in Japanese Unexamined Patent Publication 2000-261420 (P2000-2614220A) and 10-187272 (JP-A 10-187272).

According to P2000-2614220A, a phase adjusting circuit comprises two clock receiving panels having the same structure. One of the clock receiving panels is used for an active system while the other is used for a standby system.

The active system produces not only a first output clock but also a timing signal according to a first reference signal. On the other hand, the standby system produces not only a second output clock but also a collation signal according to a second reference signal. The timing signal is supplied from the active system to the standby system. The standby system produces a phase control pulse when phase difference between the timing signal and the collation pulse is larger than a predetermined value. The phase control pulse is used for adjusting the phase of the second output clock.

Thus, the phase adjusting circuit of P2000-2614220A can limit the phase difference between the first and the second output clocks to the predetermined value. However, this does not mean that the second output clock coincides with (or corresponds to) the first output clock in phase. That is, the phase difference is merely limited within the predetermined value.

According to JP-A 10-187272, a phase control system comprises two clock receiving boards having the same structure. One of the clock receiving boards is used for a master board while the other is used for a slave board.

The master board produces a master clock according to a first reference clock. On the other hand, the slave board produces not only a slave clock but also a window signal according to a second reference clock. Furthermore, the slave board adjusts phase of the slave clock so that each rising edge of the slave clock is within each high level period of the window signal.

Thus, the phase control system of JP-A 10-187272 can limit phase difference between the master and slave clocks to the high level period of the window signal. However, the phase of the slave clock does not always correspond to that of the master clock.

Figure 5:
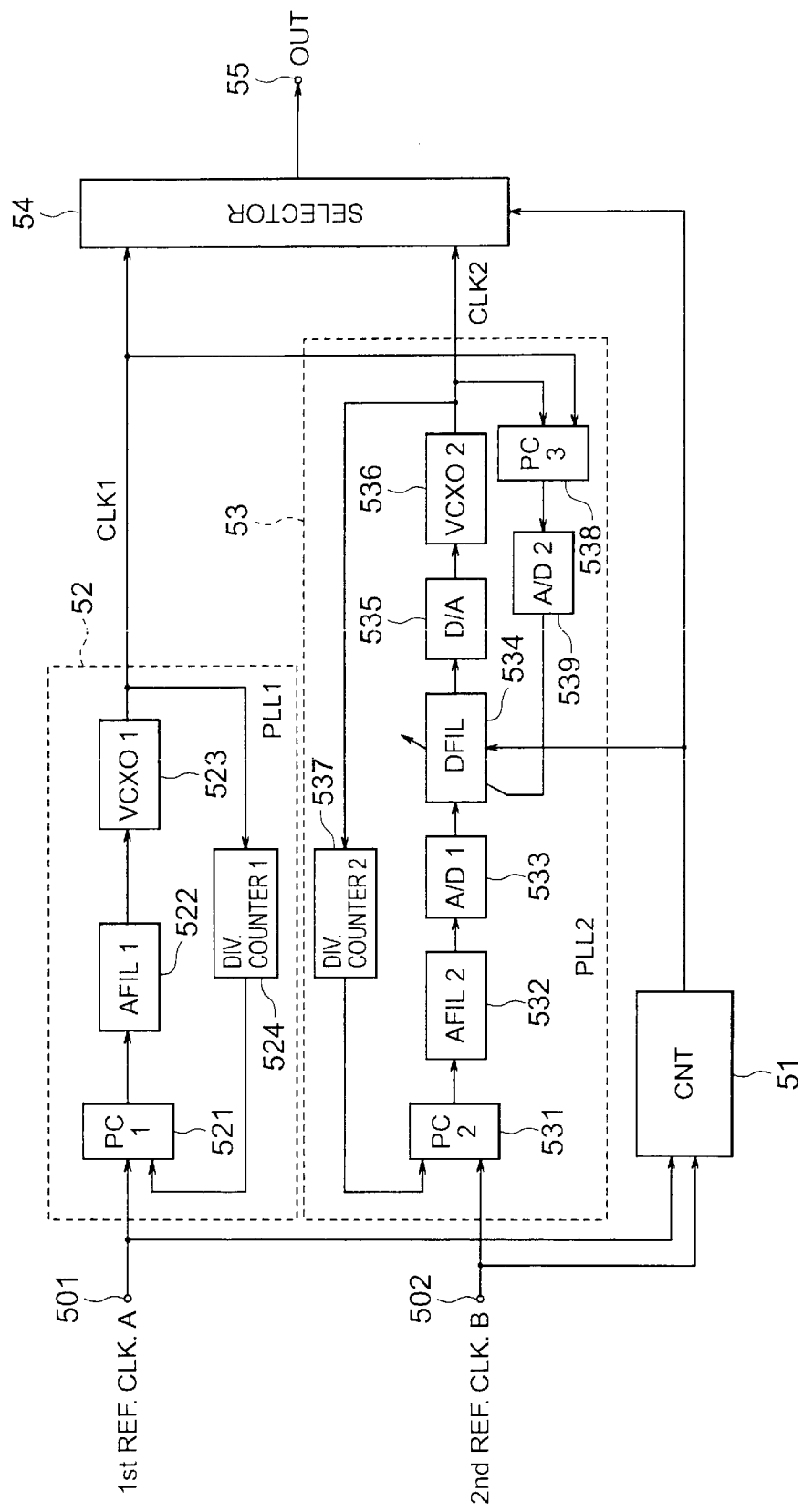
FIG. 5 is a block diagram showing a structure of a synchronous clock producing circuit according to a preferred embodiment of this invention.
Figure 6:
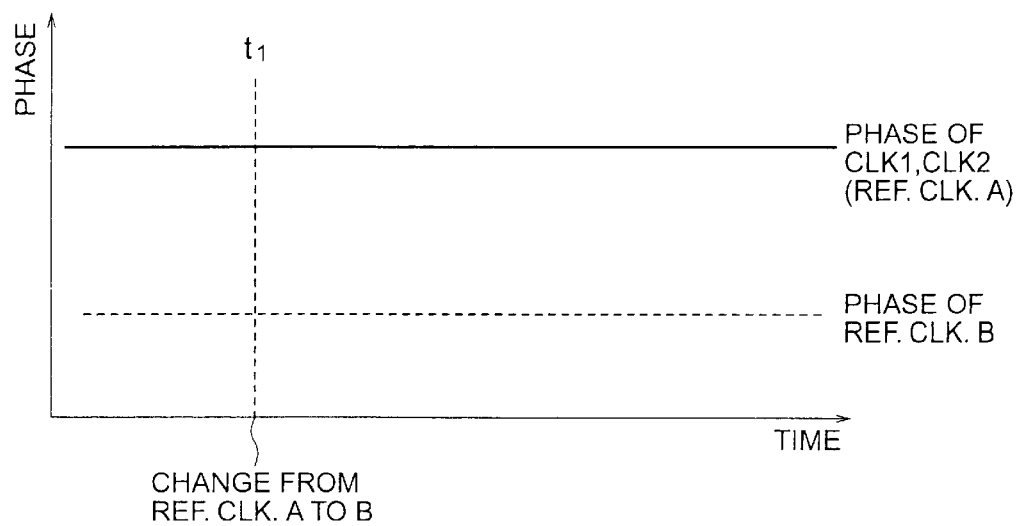
FIG. 6 is a graph showing time variation of a phase of a selected output clock produced by the synchronous clock producing circuit of FIG. 5.

Referring to FIGS. 5 and 6, the description will proceed to a clock producing circuit according to a preferred embodiment of this invention.

FIG. 5 is a block diagram showing a structure of the clock producing circuit. As illustrated in FIG. 5, the clock producing circuit comprises input terminals 501 and 502, a control unit (CNT) 51, a first phase locked loop (PLL1) 52, a second phase locked loop (PLL2) 53, a selector (SEL) 54, and an output terminal 55.

The clock producing circuit is supplied with first and second reference clocks A and B produced by two oscillators (not shown) via the input terminals 501 and 502. The first and second reference clocks A and B have the same frequency.

The control unit 51 is connected to the first and second input terminals 501 and 502 and receives both of the first and second reference clocks A and B to produces a selecting signal. The control unit 51 serves as a monitor portion and monitors a state of the first and second reference clocks A and B. When the control unit 51 receives the reference clock A, the selecting signal specifies the first reference clock A. On the other hand, when the control unit 51 does not receive the reference clock A, the selecting signal specifies the second reference clock B. The selecting signal is supplied to the second PLL 53 and the selector 54.

The first PLL 52 comprises a first phase comparator (PC1) 521, a first analog filter (AFIL1) 522, a first voltage controlled oscillator (VCXO1) 523 and a first dividing counter 524.

The first phase comparator 521 receives the first reference clock A and a first feedback clock from the first dividing counter 524 to produce a first comparison signal representing phase difference between the first reference clock A and the first feedback clock. The first analog filter 522 receives the first comparison signal and filters it to produce a first filtered comparison signal as a first voltage control signal. The first VCXO 523 produces a first output clock (CLK1) according to the first voltage control signal. The first output clock CLK1 supplied to the selector 54, the second PLL 53 and the first dividing counter 524. The first dividing counter 524 counts pulses of the first output clock CLK1 to divide a frequency of the first output clock CLK1 and to produce the first feedback clock. The first dividing counter 524 has a fixed or a variable dividing ratio.

The second PLL 53 comprises a second phase comparator (PC2) 531, a second analog filter (AFIL2) 532, a first analog to digital converter (A/D1) 533, a digital filter 534, a digital to analog converter (D/A) 535, a second voltage controlled oscillator 536, a second dividing counter 537, a third phase comparator (PC3) 538 and a second analog to digital converter (A/D2) 539.

The second phase comparator 531 receives the second reference clock B and a second feedback clock supplied from the second dividing counter 537 and produces a second comparison signal representing phase difference between the second reference clock B and the second feedback clock. The second analog filter 532 filters the second comparison signal to produce a second filtered comparison signal. The first A/D converter 533 converts the second filtered comparison signal into a digital comparison signal. The digital filter 534 filters the digital comparison signal to produce a digital filtered signal (or a digital voltage control signal). The D/A converter converts the digital filtered signal into a second voltage control signal. The second VCXO 536 produces a second output clock (CLK2) according to the second voltage control signal. The second output clock CLK2 is supplied to the selector 54, the second dividing counter 537 and the third phase comparator 538. The second dividing counter 537 counts pulses of the second output clock CLK2 to divide a frequency of the second output clock CLK2 and to produce the second feedback clock. The second dividing counter 537 has a fixed or a variable dividing ratio.

The third phase comparator 538 compares the first output clock CLK1 from the first PLL 52 with the second output clock CLK2 to produce a third comparison signal representing phase difference between the first output clock CLK1 and the second output clock CLK2. The second A/D comparator 539 converts the third comparison signal into a filter coefficient control signal. The third phase comparator 538 and the second A/D comparator 539 serves as a comparison portion to produce the filter coefficient control signal for controlling filter coefficients of the digital filter 534.

In the second PLL 53, the second phase comparator 531 serves as a principal phase comparator while the third phase comparator 538 serves as a subsidiary phase comparator.

The selector 54 receives the first and the second output clocks CLK1 and CLK2 and the selecting signal and selects one of the output clocks CLK1 and CLK2 as a selected output clock according to the selecting signal. The selected output clock is supplied to the output terminal 55. The selector 54 serves as a selecting portion together with the control unit 51.

Next, an operation of the clock producing circuit will be described in below. Herein, it is assumed that the selector 54 selects the first output clock CLK1 produced by the first PLL 52 in the beginning and selects the second output clock CLK2 produced by the second PLL 53 later. A change from the first output clock CLK1 to the second output clock CLK2 is carried out when the first reference clock A disappears.

Upon receiving the first reference clock A via the input terminal 501, the first phase comparator 521 compares the first reference clock A with the first feedback clock from the first dividing counter 524 to produce the first comparison signal. The first analog filter 522 averages the first comparison signal to produce a first averaged comparison signal as the first voltage control signal. The first VCXO 523 controls a frequency of the first output clock CLK1 according to the first voltage control signal.

The first output clock CLK1 is supplied to the selector 54 as an output of the first PLL 52 and to the first dividing counter 524. The first dividing counter 524 divides the first output clock CLK1 so that divided clock has a frequency which is approximately equal to that of the first reference clock A. The divided clock is supplied to the first phase comparator 521 as the first feedback clock.

On the other hand, upon receiving the second reference clock B via the input terminal 502, the second phase comparator 531 compares the second reference clock B with the second feedback clock from the second dividing counter 537 to produce the second comparison signal. The second analog filter 532 averages the second comparison signal to produce a second averaged comparison signal as the second filtered comparison signal. The first A/D converter 533 converts the second averaged comparison signal into the digital comparison signal.

The digital filter 534 controls filter coefficients thereof according to the filter coefficient control signal supplied from the second A/D converter 539. The filter coefficient control signal depends on the phase difference between the first and the second output clocks CLK1 and CLK2. Accordingly, the filter coefficients of the digital filter 534 are updated to reduce the phase difference between the first and second output clocks CLK1 and CLK2. A combination of the digital filter 534 and the second A/D converter 539 serves as a phase adjusting portion for adjusting the phase of the second output clock CLK2. The second output clock CLK2 substantially coincides with the first output clock CLK1.

The digital filter 534 filters the digital comparison signal by the use of the filter coefficients decided by the filter coefficient control signal.

The D/A converter 535 converts the digital filtered signal into the second voltage control signal. The second VCXO 536 controls a frequency of the second output clock CLK2 according to the second voltage control signal. The second output clock CLK2 is supplied to the selector 54 as an output of the second PLL 53 and to the second dividing counter 524 and to the third phase comparator 538.

The second dividing counter 537 divides the second output clock CLK2 so that divided clock has a frequency which is approximately equal to that of the second reference clock B (or the first reference clock A). The divided clock is supplied to the second phase comparator 531 as the second feedback clock.

As mentioned above, the digital filter 534 controls the filter coefficients thereof according to the output of the third phase comparator 538 so that no phase difference is made between the first and second output clocks CLK1 and CLK2. This means that the second output clock CLK2 has a phase offset against the second reference clock B. Therefore, the second output clock CLK2 coincides with or corresponds to both of the first output clock CLK1 and the first reference clock A in phase.

Here, because the control unit 51 controls the selector 54 to select the first output clock CLK1, the clock producing circuit outputs the first output clock CLK1.

Next, the description will be made about an operation of the clock producing circuit in a case where the first reference clock disappear.

Upon detecting absence of the first reference clock A, the control unit 51 produces the selecting signal specifying the second output clock CLK2. The selecting signal specifying the second output clock CLK2 is supplied to the digital filter 534 and the selector 54.

When the digital filter 534 receives the selecting signal specifying the second output clock CLK2, it stops controlling the filter coefficients and fixes the filter coefficients at the time. The digital filter 534 maintains the fixed filter coefficients while it receives the selecting signal specifying the second output clock CLK2.

At the same time, the selector 54 changes the selected output clock from the first output clock CLK1 to the second output clock CLK2.

As mentioned above, the second output clock CLK2 is synchronous with the first output clock CLK1. In addition, the second output clock CLK2 has the phase offset against the second reference clock B. That is, the second output clock CLK2 coincides with the first output clock CLK1. Therefore, when the selector 54 changes the selected output clock from the first output clock CLK1 to the second output clock CLK2, sharp phase shift does not occur in the selected output clock.

Additionally, the fixed filter coefficients of the digital filter 534 correspond to the phase difference between the first and second reference clocks A and B at the time of the change from the first output clock CLK1 to the second output clock CLK2. This can regard the second voltage controlled oscillator 536 as depending on the first reference clock A.

FIG. 6 shows time variation of the phase of the selected output clock before and after the change of the selected output clock from the first output clock CLK1 to the second output clock CLK2. As easily understood from FIG. 6, the phase of the selected output clock is not shifted by changing from the first output clock CLK1 to the second output clock CLK2.

Because no phase shift is caused by changing between the first (or active) and second (or standby) output clocks, the clock producing circuit is suitable for a wide band code dividing multiple access (W-CDMA) system which needs stable supply of a clock.

While this invention has thus far been described in conjunction with the preferred embodiments thereof, it will readily be possible for those skilled in the art to put this invention into practice in various other manners. For example, the first PLL 52 may adopt another known structure.

What is claimed is:

1. A clock producing circuit receiving first and second reference clocks at first and second input terminals and comprising:
    a first phase locked loop connected to said first input terminal for receiving said first reference clock to produce a first output clock having first phase according to said first reference clock;
    a second phase locked loop having a digital filter with filter coefficients and connected to said second input terminal for receiving said second reference clock to produce a second output clock having second phase according to said second reference clock; and
    a comparing portion connected to said first phase locked loop and said second phase locked loop for comparing said first phase with said second phase to supply a filter coefficient control signal representative of difference between said first phase and said second phase to said digital filter;
    wherein said digital filter updates said filter coefficients according to said filter coefficient control signal so as to reduce said difference between said first phase and said second phase.

2. A clock producing circuit claimed in claim 1, wherein said clock producing circuit further comprises:
    a monitor portion connected to said first and second terminals for monitoring said first and second reference clocks to produce a selecting signal specifying one of said first and second output clocks; and
    a selector connected to said first and second phase locked loops for selecting one of said first and second output clocks according to said selecting signal.

3. A clock producing circuit claimed in claim 2, said monitor portion further connected to said digital filter for supplying said selecting signal to said digital filter; wherein said digital filter stops updating said filter coefficients when said selecting signal specifies said second output clock.

4. A clock producing circuit claimed in claim 3, wherein said digital filter maintains said filter coefficients when said selecting signal specifies said second output clock.

5. A clock producing circuit having first and second phase locked loops for producing first and second output clocks according to first and second reference clocks, said clock producing circuit comprising:
    a subsidiary phase comparator connected to said first and second phase locked loops for comparing phase of said first output clock with that of said second output clock to produce a subsidiary comparison signal representing phase difference between said first and second output clocks; and
    a phase adjusting portion included in said second phase locked loop and connected to said subsidiary phase comparator for adjusting phase of said second output clock on the basis of said subsidiary comparison signal so that said phase of said second output clock coincides with that of said first output clock;
    wherein said phase adjusting portion comprises a digital filter with filter coefficients which are updated according to said comparison signal.

6. A clock producing circuit as claimed in claim 6, wherein said digital filter stops updating said filter coefficients when said first reference clock disappears.

7. A clock producing circuit having first and second phase locked loops for producing first and second output clocks according to first and second reference clocks, said clock producing circuit comprising:
    a subsidiary phase comparator connected to said first and second phase locked loops for comparing phase of said first output clock with that of said second output clock to produce a subsidiary comparison signal representing phase difference between said first and second output clocks; and
    a phase adjusting portion included in said second phase locked loop and connected to said subsidiary phase comparator for adjusting phase of said second output clock on the basis of said subsidiary comparison signal so that said phase of said second output clock coincides with that of said first output clock;
    said phase adjusting portion producing a digital voltage control signal to adjust said phase of said second output clock, wherein said second phase locked loop further comprises:
        a principal phase comparator for comparing phase of said second reference clock with that of a feedback signal to produce a principal comparison signal;
        an analog filter connected to said principal comparator for filtering said principal comparison signal to produce a filtered signal;

an analog to digital converter connected between said analog filter and said phase adjusting portion for converting said filtered signal into a converted filtered signal which supplied to said phase adjusting portion;

a digital to analog converter connected to said phase adjusting portion for converting said digital voltage control signal formed from said converted filtered signal by phase adjusting portion into an analog voltage control signal;

a voltage controlled oscillator connected to said digital to analog converter, said principal phase comparator and said subsidiary phase comparator for producing said second output clock according to said analog voltage control signal; and a dividing counter connected between said voltage controlled oscillator and said principal phase comparator for counting pulses of said second output clock to produce said feedback signal.

8. A clock producing circuit having first and second phase locked loops for producing first and second output clocks according to first and second reference clocks, said clock producing circuit comprising:

a subsidiary phase comparator connected to said first and second phase locked loops for comparing phase of said first output clock with that of said second output clock to produce a subsidiary comparison signal representing phase difference between said first and second output clocks; and a phase adjusting portion included in said second phase locked loop and connected to said subsidiary phase comparator for adjusting phase of said second output clock on the basis of said subsidiary comparison signal so that said phase of said second output clock coincides with that of said first output clock;

wherein said clock producing circuit further comprises:

a selecting portion connected to said first and second phase locked loops for selecting one of said first and second output clocks according to state of said first and second reference clocks.

9. A clock producing method comprising the steps of:

producing a first output clock according to a first reference clock by the use of a first phase locked loop;

producing a second output clock according to a second reference clock by the use of a second phase locked loop;

comparing phase of said first output clock with that of said second output clock to produce a comparison signal representing phase difference between said first and said second output clocks; and adjusting phase of said second output clock according to said comparison signal by the use of a digital filter included in said second phase locked loop so as to reduce said phase difference.

10. A clock producing method as claimed in claim 9, wherein said clock producing method further comprising the step of:

stopping the adjusting step when said first reference clock disappears.

11. A clock producing circuit having first and second phase locked loops for producing first and second output clocks according to first and second reference clocks, said clock producing circuit comprising:

a subsidiary phase comparator connected to said first and second phase locked loops for comparing phase of said first output clock with that of said second output clock to produce a subsidiary comparison signal representing phase difference between said first and second output clocks; and a phase adjusting portion included in said second phase locked loop and connected to said subsidiary phase comparator for adjusting phase of said second output clock on the basis of said subsidiary comparison signal so that said phase of said second output clock always coincides with that of said first output clock.

* * * * *